(12) United States Patent
Abdolvand et al.

(10) Patent No.: US 10,892,735 B2
(45) Date of Patent: Jan. 12, 2021

(54) PASSIVE WIRELESS SENSOR INCLUDING PIEZOELECTRIC MEMS RESONATOR

(71) Applicant: University of Central Florida Research Foundation, Inc., Orlando, FL (US)

(72) Inventors: Reza Abdolvand, Winter Park, FL (US); Seyedeh Hediyeh Fatemi, Oviedo, FL (US); Mohammad Modarres-Zadeh, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 16 days.

(21) Appl. No.: 14/598,891

(22) Filed: Jan. 16, 2015

(65) Prior Publication Data

US 2016/0211826 A1    Jul. 21, 2016

(51) Int. Cl.
| H03H 9/17 | (2006.01) |
| H03H 9/02 | (2006.01) |
| H04Q 9/00 | (2006.01) |
| H03H 9/15 | (2006.01) |

(52) U.S. Cl.
CPC .......... *H03H 9/17* (2013.01); *H03H 9/02244* (2013.01); *H03H 9/02535* (2013.01); *H04Q 9/00* (2013.01); *H03H 2009/155* (2013.01); *H04Q 2209/40* (2013.01)

(58) Field of Classification Search
CPC .. H03H 9/17; H03H 9/02244; H03H 9/02535; H04Q 9/00; H04Q 2209/40
See application file for complete search history.

(56) References Cited

U.S. PATENT DOCUMENTS

| 6,909,221 B2 * | 6/2005 | Ayazi | H03H 3/02 310/312 |
| 7,243,544 B2 * | 7/2007 | Liu | G01P 15/0975 73/514.28 |
| 7,518,474 B1 * | 4/2009 | Pulskamp | H01H 57/00 333/105 |
| 8,350,633 B1 * | 1/2013 | Abdolvand | H03B 5/323 331/155 |

(Continued)

OTHER PUBLICATIONS

Piazza et al., Voltage-tunable piezoelectrically-transduced single-crystal silicon micromechanical resonators, Sensors and Actuators A 111 (2004) 71-78.

(Continued)

*Primary Examiner* — Patrick N Edouard
*Assistant Examiner* — Eboni N Giles
(74) *Attorney, Agent, or Firm* — Fleit Intellectual Property Law; Thomas S. Grzesik

(57) ABSTRACT

A passive wireless sensor includes a substrate having at least one Microelectromechanical system (MEMS) piezoelectric resonator thereon. The MEMS piezoelectric resonator includes a piezoelectric layer between a top metal or semiconductor layer (top electrode layer) and a bottom metal or semiconductor layer (bottom electrode layer). The top electrode layer is a patterned top electrode layer including at least a first electrode for sensing an electrical signal and a second electrode for providing a ground reference. An antenna is connected to the first and/or second electrode for wirelessly transmitting the electrical signal and for receiving a wireless interrogation signal.

18 Claims, 8 Drawing Sheets

(56) References Cited

U.S. PATENT DOCUMENTS

| | | | |
|---|---|---|---|
| 8,367,305 B1* | 2/2013 | Wojciechowski | H03H 9/462 430/319 |
| 2004/0130442 A1* | 7/2004 | Breed | B60C 11/24 340/443 |
| 2006/0290449 A1* | 12/2006 | Piazza | H03H 9/172 333/187 |
| 2008/0246559 A1* | 10/2008 | Ayazi | H03H 9/172 333/187 |
| 2010/0066467 A1* | 3/2010 | Ayazi | H03H 9/172 333/187 |
| 2010/0156629 A1 | 6/2010 | Sexton et al. | |
| 2010/0321191 A1* | 12/2010 | Gong | G01K 1/024 340/584 |
| 2012/0074818 A1* | 3/2012 | Crowley | G01C 19/5769 310/348 |
| 2012/0176609 A1 | 7/2012 | Seppä et al. | |
| 2013/0078968 A1* | 3/2013 | Breed | G01S 13/878 455/414.1 |
| 2013/0140958 A1 | 6/2013 | Chen et al. | |

OTHER PUBLICATIONS

Gianluca Piazza et al., "Voltage-tunable piezoelectrically-transduced single-crystal silicon micromechanical resonators", Elsevier, 2003, Sensors and Actuators A 111 (2004), pp. 71-78.

* cited by examiner

PASSIVE WIRELESS SENSOR INCLUDING PIEZOELECTRIC MEMS RESONATOR

FIELD

Disclosed embodiments relate to passive wireless sensors for sensing physical parameters.

BACKGROUND

Resonant sensors are a known solution for sensing physical parameters such as pressure, temperature, viscosity, or mass. The primary advantage of resonant sensors is that their output is a frequency or phase change which can be directly fed into a digital circuit unlike analog sensors which need digital conversion. Temperature-dependent quartz, surface acoustic wave (SAW) and MEMS resonators have all been incorporated in oscillator circuits to yield temperature sensors with high resolution.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize known resonant sensors would be inefficient as passive wireless temperature sensors because of: (I) a need for bias voltages for operation of the resonator, (II) a low temperature-dependency of the resonant frequency leading to low resolution, (III) high motional resistance of the resonator leading to power loss in the resonator and consequently a decrease in the sensing distance, and (IV) the quality factor (Q) of the resonator is low leading to a low signal to noise (SNR) ratio and consequently a low temperature (or other physical parameter) resolution. Disclosed embodiments also recognize while thin-film piezoelectric microelectromechanical systems (MEMS) resonators offer smaller size and lower manufacturing/packaging cost compared to their surface acoustic wave (SAW) counterparts, no sensor system has been reported that utilizes piezoelectric MEMS resonators in a passive or a wireless configuration.

Disclosed piezoelectric MEMS resonators harvest energy from a received RF interrogation signal from a base unit (wireless transceiver) to operate and transmits data back to the base unit generally in just few microseconds. The piezoelectric MEMS resonator can be engineered to be sensitive to one or more physical parameters. The passive wireless sensing element is small in size and has a foot print typically less than few mms square. Because of its small size, disclosed passive wireless sensors only consume a very small amount of the received power to operate and uses most of the received energy to send the measured data back to the base unit. Since the sensor itself is passive, its life span is not limited by batteries, and it can be mounted on moving parts located in hard to reach places such as inside of an engine where there is no regular maintenance required.

Being wireless also makes the use of disclosed passive wireless sensors possible in rotating objects such as tires. The passive wireless sensor along with its antenna can be designed to operate at essentially any desired frequency based on the application. A large number of disclosed passive wireless sensor die can be fabricated on each wafer in a CMOS-based foundry, making disclosed passive wireless sensors inexpensive relative to other physical parameter sensors. In addition, several separate passive wireless sensors can be fabricated on one substrate (e.g., die) providing different or multiple resonant frequencies and with independent sensitivities upon request or a specific application.

The term "MEMS devices" as used herein takes on its meaning in the art that being integrally formed devices formed using integrated circuit (IC) processing (e.g., thin film deposition, lithography, etching) all on a common substrate (e.g., silicon) that integrate electrical and mechanical functionality on the micro- and nano-scale. The dimensions in the nanometer range lead to low mass and high mechanical resonance frequencies. MEMS devices lack an adhesive between respective layers.

BRIEF DESCRIPTION OF THE DRAWINGS

Reference will now be made to the accompanying drawings, which are not necessarily drawn to scale, wherein:

FIG. 5A shows a waveform as received by the oscilloscope showing the interrogation signal and the resonator decay response. This measurement was performed with transmit power of 0.5 W at 10 cm distance between the antennas, while

DETAILED DESCRIPTION

Figure 1:
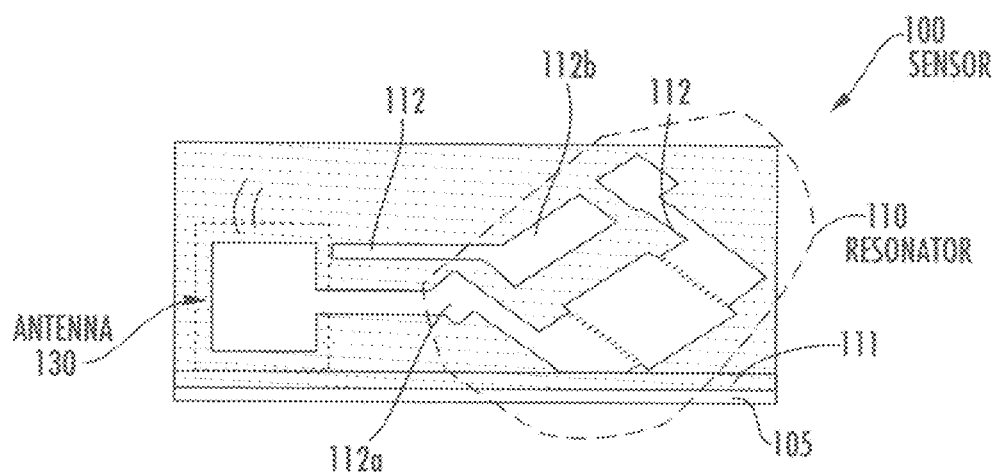
FIG. 1 is a depiction of an example passive wireless sensor comprising a MEMS piezoelectric resonator thereon including a piezoelectric layer between a top metal or semiconductor layer (top electrode layer) and a bottom metal or semiconductor layer (bottom electrode layer) and an antenna connected to a first and second electrode for receiving a wireless interrogation signal from a base unit/transceiver and wirelessly transmitting a sensed electrical signal responsive to the interrogation signal to the base unit/transceiver, according to an example embodiment.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is a depiction of an example passive wireless sensor 100 including a handle support substrate 105 having at least one MEMS piezoelectric resonator 110 thereon. MEMS piezoelectric resonator is actually shown as a portion of a MEMS piezoelectric resonator in cross-section. The MEMS piezoelectric resonator 110 includes a piezoelectric layer 111 between a top metal or semiconductor layer (top electrode layer 112) and a bottom metal or semiconductor layer (bottom electrode layer) shown provided by the handle support substrate 105. The MEMS piezoelectric resonator 110 can comprise a contour-mode MEMS piezoelectric resonator, a thin-film piezoelectric-on-semiconductor (TPoS) resonator, or other MEMS piezoelectric resonator.

The top electrode layer 112 is a patterned layer including at least a first electrode 112a for sensing an electrical signal and a second electrode 112b for providing a ground reference. An on-chip antenna 130 shown as a patch antenna only as an example antenna is connected by a trace on the top electrode layer 112 to the first electrode 112a and to second electrode 112b for wirelessly transmitting the generated electrical signal and for receiving a wireless interrogation signal from a base unit/transceiver. As known in the art, a patch antenna comprises a flat rectangular sheet or "patch" of metal, mounted over a larger sheet of metal called a ground plane. The patch antenna can use a patch which is one-half wavelength long, mounted a precise distance above a larger ground plane, sometimes using a spacer comprising a dielectric between them. The antenna may also be off the substrate/chip. The on-chip antenna 130 can include antennas other than patch antennas.

The piezoelectric material for piezoelectric layer 111 can comprise aluminum nitride (AlN), zinc oxide (ZnO), aluminum gallium arsenide (AlGaAs), Gallium Nitride (GaN), quartz or other piezoelectric materials such as zinc-sulfide, cadmium-sulfide, lithium tantalate, or lithium niobate. The piezoelectric layer 111 is a thin film layer having a thickness generally between 100 nm and 5 µm.

Disclosed embodiments include methods of wirelessly sensing at least one physical parameter using a disclosed passive wireless sensor including a MEMS piezoelectric resonator connected to an antenna which can be on-chip or off-chip. The MEMS piezoelectric resonator is wirelessly excited by an interrogation signal, wherein the MEMS piezoelectric resonator provides a decay response of an amplitude of oscillation (decay response) responsive to the interrogation signal. The decay response is analyzed to obtain a resonant frequency of the MEMS piezoelectric resonator. A physical parameter is determined from the resonant frequency, such as temperature, pressure, stress, or strain.

The analyzing can comprise performing as Fourier transform on the decay response to obtain the resonant frequency and the determining the physical parameter from the resonant frequency can comprise calculating the physical parameter from the resonant frequency and a coefficient of resonant frequency as a function of the particular physical parameter. The interrogation signal can be tuned to a resonant frequency of the MEMS piezoelectric resonator.

The method can further comprise dynamically tuning a frequency of the interrogation signal during the wirelessly exciting. The interrogation signal can comprises a pulse-modulated sinusoidal radio frequency (RF) signal. In one embodiment the pulse-modulated sinusoidal RF signal is gated in the time domain to provide intervals without the interrogation signal for use during the analyzing.

The MEMS piezoelectric resonator can be utilized within an enclosed volume. For example, the enclosed volume can comprise an inside of an engine (for measuring engine temperature) or an inside of a tire (for measuring tire pressure).

Figure 2A:
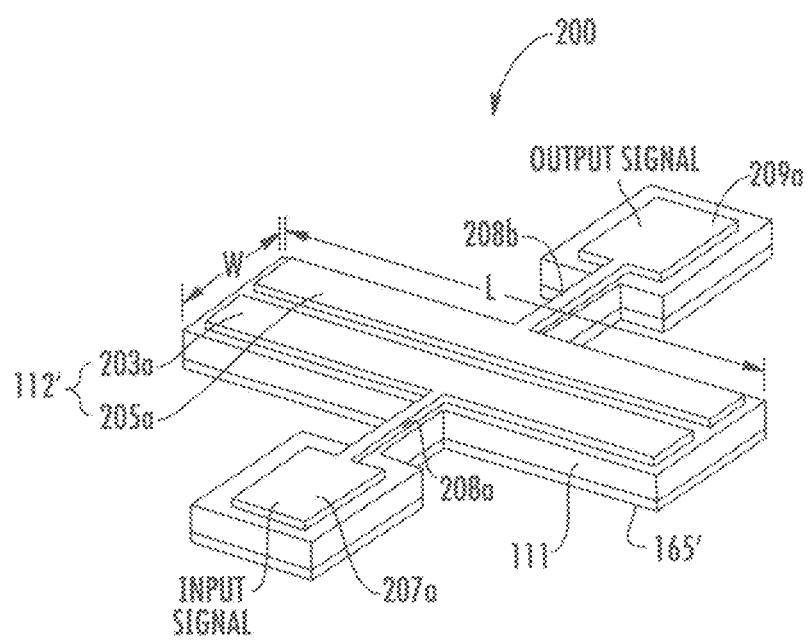
FIG. 2A is a depiction of a rectangular-shaped contour-mode MEMS piezoelectric resonator, according to an example embodiment.

FIG. 2A is a depiction of a rectangular-shaped contour-mode MEMS piezoelectric resonator 200, according to an example embodiment. The contour-mode MEMS piezoelectric resonator 200 is a suspended resonator that has electrodes 203a, 205a placed parallel to the plate length shown as L and width shown as W, and having an input signal port 207a and an output signal port 209a that provides a way for applying an alternating electric field across the thickness of the contour-mode MEMS piezoelectric resonator 200. A "port" as used herein refers to a signal connection and a ground connection on a MEMS piezoelectric resonator.

The contour-mode MEMS piezoelectric resonator 200 is shown having a bottom electrode layer 165' such as a Pt providing a bottom electrode layer and a top electrode layer 112' such as Al. Disposed between the top electrode layer 112' and bottom electrode layer 165' (electrodes) is piezoelectric layer 111, such as AlN. The electric field induced is configured to cause the contour-mode MEMS piezoelectric resonator 200 to have a contour mode in-plane lateral displacement that is substantially in the plane of the planar surface of the resonator, wherein the fundamental frequency for the displacement of the contour-mode MEMS piezoelectric resonator 200 is set in part lithographically by the planar dimension of the bottom electrode, the top electrode or the piezoelectric layer 111.

In operation a vertical electric field applied across the thickness of the piezoelectric layer 111 induces extensional mechanical stress in the plane of the piezoelectric layer 111 which excites the structures in a dilation-type contour mode. A two-port configuration is shown in FIG. 2A. In order to minimize anchor losses, the contour-mode MEMS piezoelectric resonator 200 is shown suspended by two quarter-wavelength ($\lambda/4$) tethers 208a, and 208b.

Figure 2B:
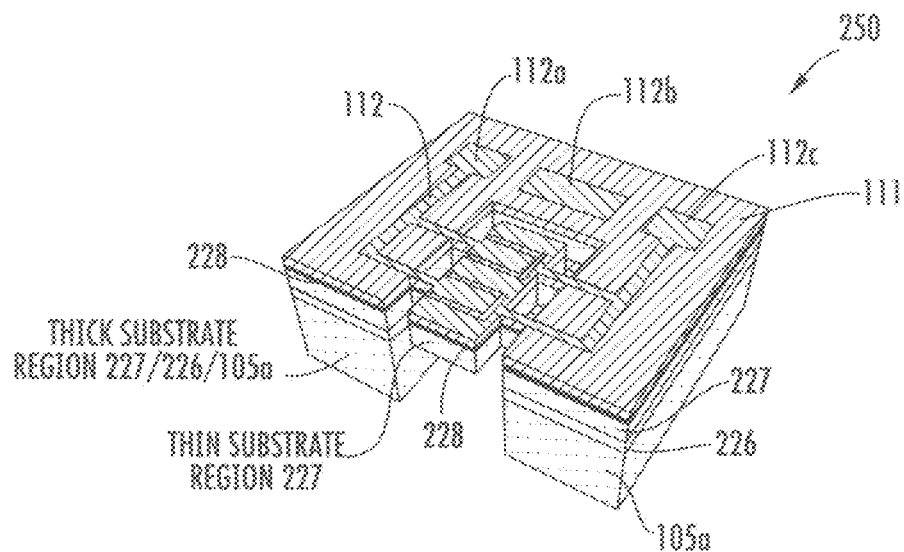
FIG. 2B is a depiction of a 5th-order thin-film piezoelectric-on-semiconductor (TPoS) resonator.
Figure 2C:
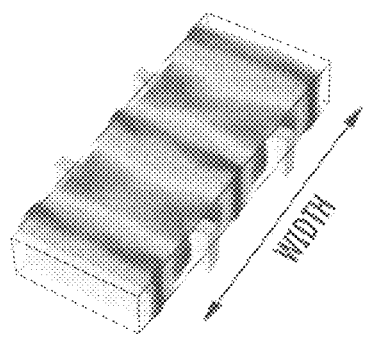
FIG. 2C shows the stress profile of a silicon slab with two pairs of fixed tethers at the 5th-order width-extensional mode, according to an example embodiment.

FIG. 2B is a depiction of a 5th-order TPoS resonator 250 and FIG. 2C the stress profile of a silicon slab with two pairs of fixed tethers at the 5th-order width-extensional mode, according to an example embodiment. The TPoS resonator 250 comprises a piezoelectric layer 111 sandwiched between top electrode layer 112 and bottom electrode layer 228 which is on a top substrate portion (e.g., Si) which provides the thin substrate region 227. There is also a thick substrate region 227/226/105a.

The TPoS resonator 250 is a suspended resonator that is anchored to the substrate by tethers placed at zero-displacement nodes of the TPoS resonator 250. The top electrode layer 112 shown is generally a metal that is patterned, and as shown is patterned so that the top electrodes mimic the stress field in the structure at a targeted resonant mode as depicted in FIG. 2C. The darker areas shown in FIG. 2C indicate a relatively high stress level, so there are five relatively high stress areas shown as the TPoS resonator 250 is a 5th order design. The three areas shown with a darkest shade are under compressive stress, while the two areas in between are shown with a somewhat lighter shade to indicate a tensile stress.

Again referring to FIG. 2B, the top electrode layer 112 is shown providing an interdigitated pattern over the thin substrate region 227. The interdigitated top electrode layer helps achieve the small motional resistance and higher Q for TPoS resonator 250 or other disclosed MEMS piezoelectric resonator. The piezoelectric layer 111 is actuated (vibrated) by the electric field applied between the top electrode layer 112 and bottom electrode layer 228 and consequently an acoustic wave is launched in the bulk of the TPoS resonator 250 within the piezoelectric layer 111.

A semiconductor (e.g., silicon) on insulator (SOI) substrate utilized for TPoS resonator 250 is a known substrate used in some processes for the fabrication of complementary metal-oxide-semiconductor (CMOS) integrated circuits. Disclosed TPoS resonators are not limited to SOI substrates, and other substrates such as diamond-on-silicon may also be used. Bulk semiconductor substrates may also be used.

Regarding TPoS resonator 250 ports in FIG. 2B, comprise a signal connection and a ground connection. Either of the smaller rectangular bond pads referred to above as first electrode 112a, and the electrode 112c also shown in FIG. 2B can provide the signal connection, and the larger rectangular bond pad referred to above as the second electrode 112b can provide the ground connection of the port. Accordingly, TPoS resonator 250 has two ports which only one of them is used when the TPoS resonator 250 is utilized as a passive wireless sensor. However, disclosed embodiments are not limited to two-port resonators.

TPoS resonators such as TPoS resonator 250 provide high Q and low motional resistance all in a very small footprint. TPoS resonators can be designed in either one-port or two-port configuration. In a two-port design, the TPoS resonator is excited through one of the ports and the other port is used to sense the vibration. Whereas in a one-port configuration, both excitation and sensing are performed through one of the ports while the second port can be exploited to tune the resonance frequency of the TPoS resonator.

Figure 2D:
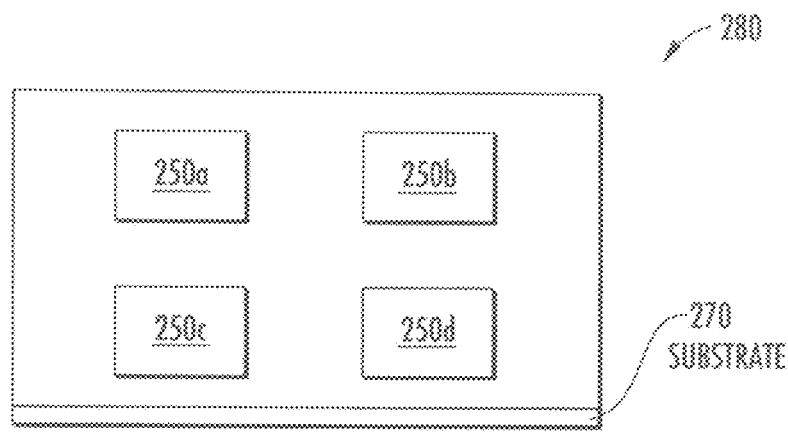
FIG. 2D depicts an example wireless passive sensor including a plurality of MEMS piezoelectric resonators all on a common substrate, according to an example embodiment.

FIG. 2D depicts an example wireless passive sensor 280 including a plurality of MEMS piezoelectric resonators shown as 250a, 250b, 250c and 250d all on a common substrate shown as substrate 270. The MEMS piezoelectric resonators 250a, 250b, 250c and 250d each have different layouts so that they each provide a different resonant frequency.

Figure 3:
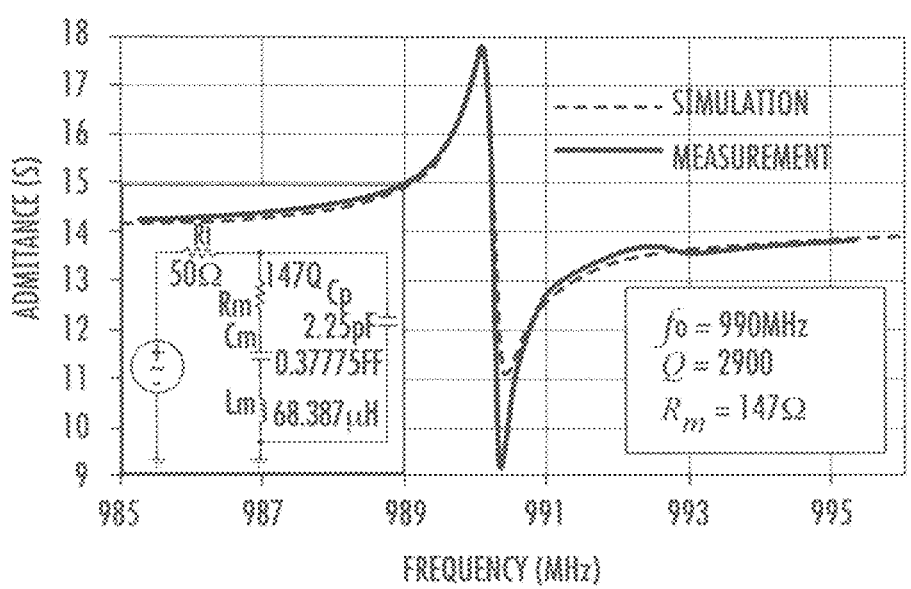
FIG. 3 shows one-port frequency characteristics an example TPoS resonator, according to an example embodiment. The inset is the equivalent circuit model.

FIG. 3 shows the frequency response of a $21^{st}$-order TPoS resonator which exhibits a Q of 2,900 in air and motional resistance of 147Ω at 990 MHz. The impulse response of a TPoS resonator decays exponentially ($e^{-t/\tau}$) where the time constant $\tau$ is equal to $$\frac{2Q}{\omega_o}$$

by definition. This implies that the envelope of the response decreases by 98% in 4τ seconds. The high Q of this TPoS resonator results in a relatively long decay time of 4 μs. The sensitivity of the TPoS resonator to temperature is a function of device's temperature coefficient of frequency (TCF):

$$f = (TCF \cdot \Delta T + 1) \cdot f_0 \quad (1)$$

which is in turn a function of the stack materials for the resonator which can be approximated according to equation (2):

$$TCF_{total} = \frac{TCF_{Mo} \cdot t_{Mo} + TCF_{AlN} \cdot t_{AlN} + TCF_{Si} \cdot t_{Si}}{t_{Mo} + t_{AlN} + t_{Si}} \quad (2)$$

where t denotes the corresponding film thickness with the top electrode layer shown as Mo in Equation 2, the piezoelectric layer 111 as AlN in Equation 2, and the bottom electrode layer 228 as Si in Equation 2.

In the case of a temperature sensor, in order to realize a temperature sensor with high resolution, large TCF values are desirable. This is achieved by using an un-doped or lightly-doped silicon as the starting substrate so that the bottom electrode layer 228 is un-doped or lightly-doped. In one example, the substrate comprises a 5 μm thick boron-doped silicon substrate with a fairly low resistivity of 1 to 20 Ω·cm. To characterize the resonator's TCF, the resonator was placed in a temperature-controlled chamber and heated up from room temperature to +85° C. in 5° C. increments while the resonance frequency was recorded using a network analyzer (R&S-ZNB8) in a one-port configuration. A linear TCF of −30 ppm/° C. was measured for this temperature range.

Regarding a wireless measurement setup, to utilize a piezoelectric MEMS resonator as a wireless sensor, the piezoelectric MEMS resonator can be interrogated by a pulse-modulated sinusoidal signal which forces the piezoelectric MEMS resonator into oscillation. The resonator decay response is then captured and evaluated to determine the physical parameter, such as temperature.

Figure 4:
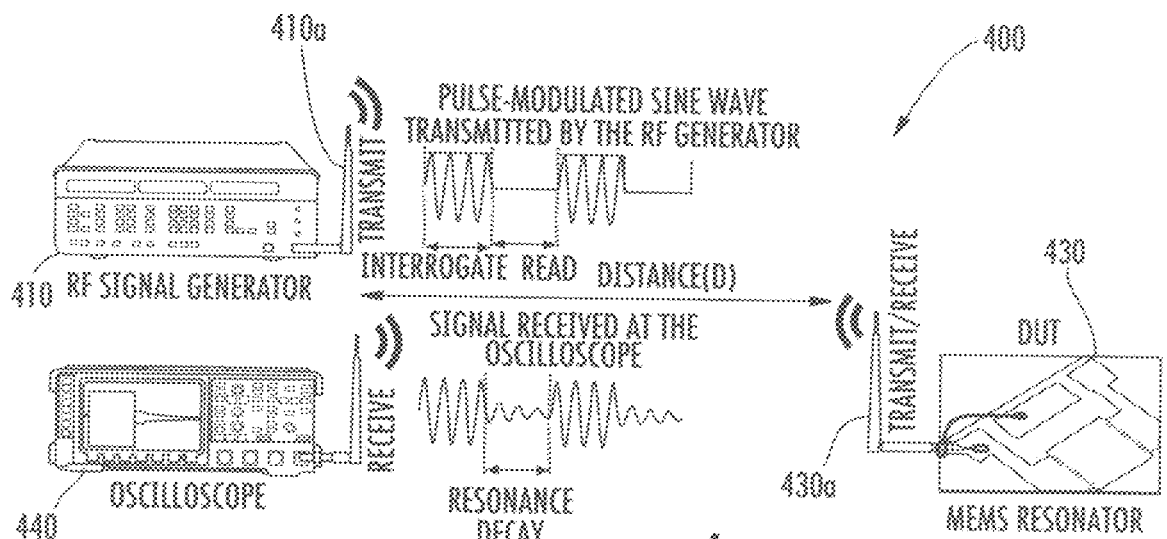
FIG. 4 shows a measurement setup for an example wireless temperature sensor. The piezoelectric MEMS resonator shown on the right is a high-order multi-tether design and is directly connected to an external antenna.

A schematic view of an example wireless measurement setup 400 is shown in FIG. 4. An RE signal generator 410 transmits a pulse-modulated sine wave through an antenna 410a such as a 3 dBi antenna. The MEMS piezoelectric resonator 430 treated as a device under test (DUT) is interrogated during the pulse on-time and its response is analyzed during the pulse off-time. The MEMS piezoelectric resonator 430 is directly connected to an antenna 430a such as a 5 dBi antenna with no additional circuitry, which is forced into oscillation upon receiving the interrogation signal. The interrogation period (on-time) is long enough for the MEMS piezoelectric resonator 430 to reach its maximum oscillation amplitude.

If the frequency of the sine wave is equal to the natural resonance frequency of the MEMS piezoelectric resonator 430, the amplitude of oscillations will be maximized. The frequency of the sine wave can be dynamically tuned during the interrogation to match the resonance frequency of the MEMS piezoelectric resonator 430 in order to maximize the amplitude of the resonator response, and thus provide a larger signal to noise ratio. At the end of the pulse, the MEMS piezoelectric resonator's 430 oscillation amplitude starts to decay over a period of 4τ as explained above.

Figure 5A:
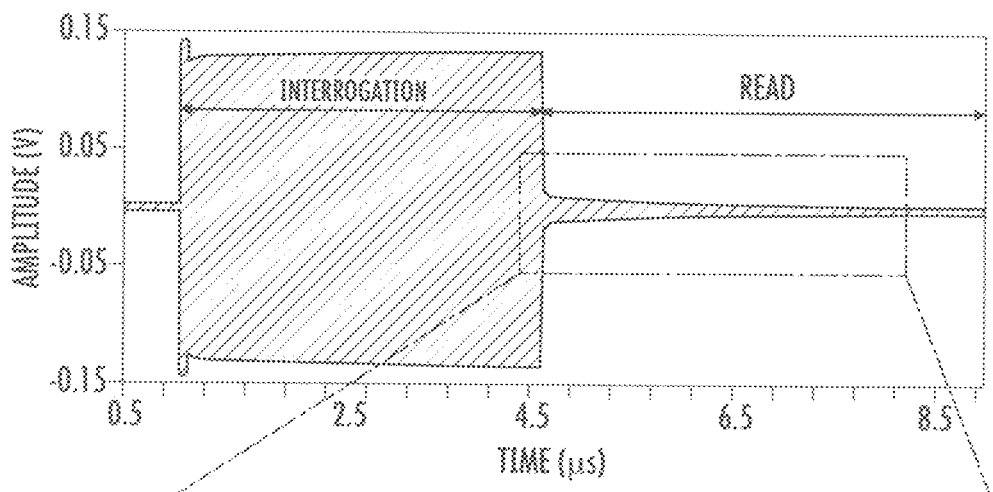

An oscilloscope 440 with a high sampling rate is used to collect the signal in real time (see the example signal received at the oscilloscope antenna) 5 dBi antenna is connected to the oscilloscope 440. FIG. 5A exhibits the waveform received by the oscilloscope 440 showing the interrogation signal and the response of the MEMS piezoelectric resonator 430. It is noted that the much stronger interrogation signal is directly received from the RF signal generator 410 during the on-time.

Figure 5B:
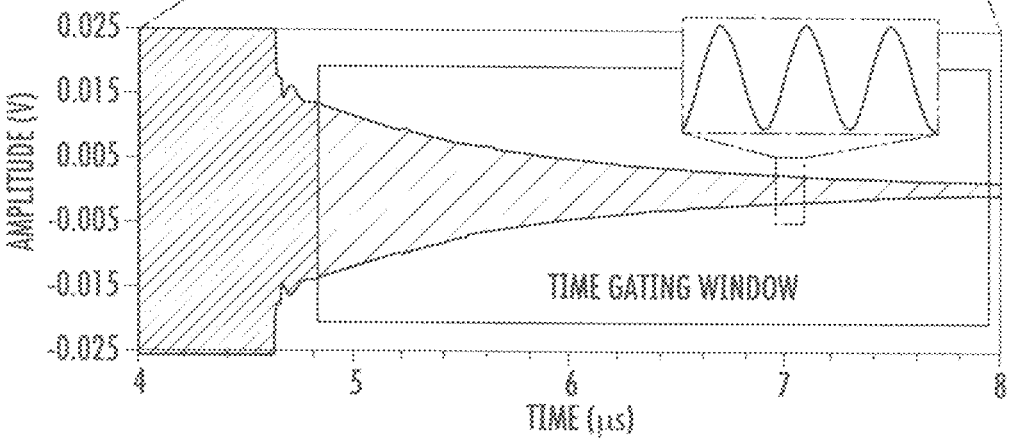
FIG. 5B shows a waveform close-up and the time gate window used for taking a fast Fourier transform (FFT).
Figure 6:
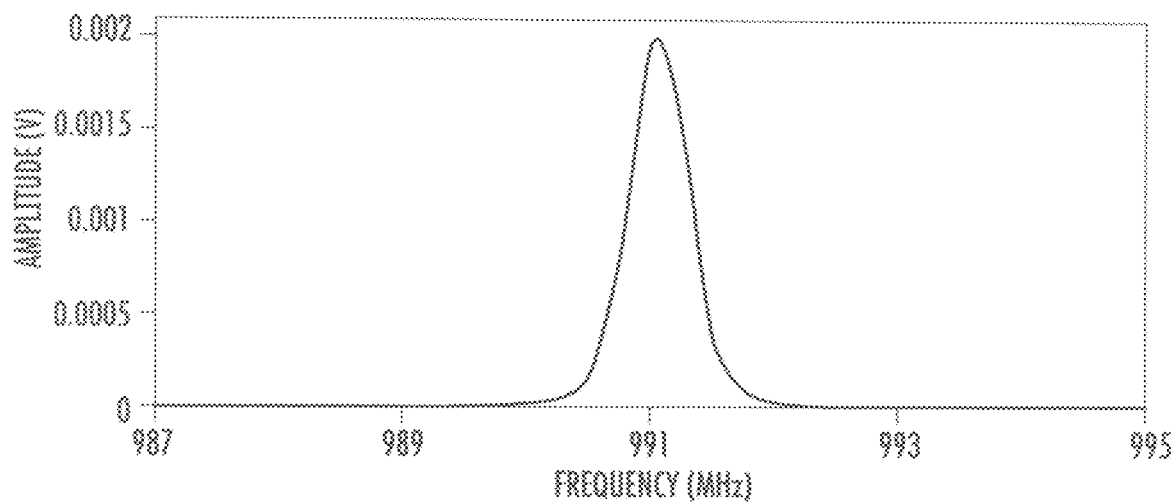
FIG. 6 shows the spectral density of the resonator decay response after taking a Fourier transform of the time-gated waveform of FIG. 5B.

In order to eliminate the interrogation signal at the receiver, the waveform can be gated in the time domain as shown in FIG. 5B. An additional 200 ns after the end of the interrogation pulse can be ignored to account for the environmental echoes. A fast Fourier transform (FFT) is then taken on the signal such as using LABVIEW software in order to extract the resonance frequency of the MEMS piezoelectric resonator 430 as shown in FIG. 6. The temperature or other physical parameter can then be calculated from the resonance frequency and physical parameter coefficient of frequency, such as the TCF when sensing temperature.

Disclosed passive wireless temperature sensors can be used in a variety of applications including rotating jet engines. Passive wireless pressure sensors can be used for measuring air pressure in car tires. The pressure sensor can be altered in such a way to measure the air flow during human breathing for diagnosing sleep related problems. Disclosed sensors can be used as a strain sensor to detect human pulse or blood pressure. A disclosed wireless temperature sensor in an appropriate package can be used to measure the temperature inside a food. Disclosed sensors can be used as disposable temperature sensors to monitor infants' body temperature.

Examples

Disclosed embodiments are further illustrated by the following specific Examples, which should not be construed as limiting the scope or content of this Disclosure in any way. For example, although described for temperature sensing, disclosed passive wireless sensors can be used to sense other physical parameters.

Figure 7:
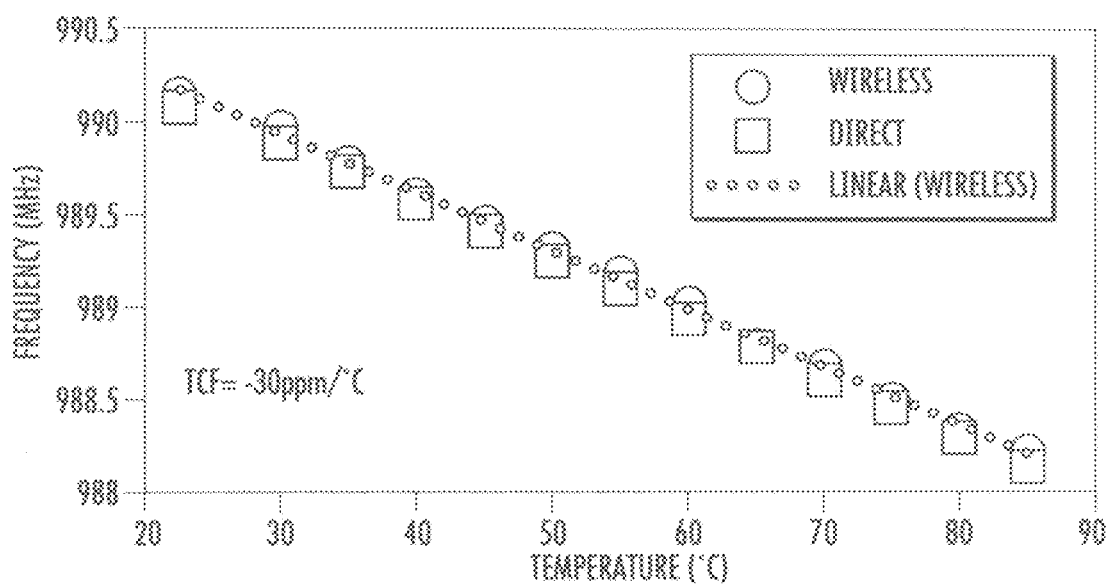
FIG. 7 shows the resonance frequency vs. the MEMS piezoelectric resonator's temperature measured with direct and wireless configurations. The slight frequency shift between the two cases is due to different loading effects on the MEMS piezoelectric resonator.

In order to characterize an example passive temperature sensor, the MEMS piezoelectric resonator is put into a temperature-controlled chamber and is connected to an antenna on the outside. The wireless configuration described above is used to measure the frequency variations over the same temperature range as described above. The interrogation signal power was set to 500 mW and the distance (D) to 1 m. FIG. 7 compares the results of direct and wireless measurements. A TCF of −30 ppm/° C. is shown.

Figure 8:
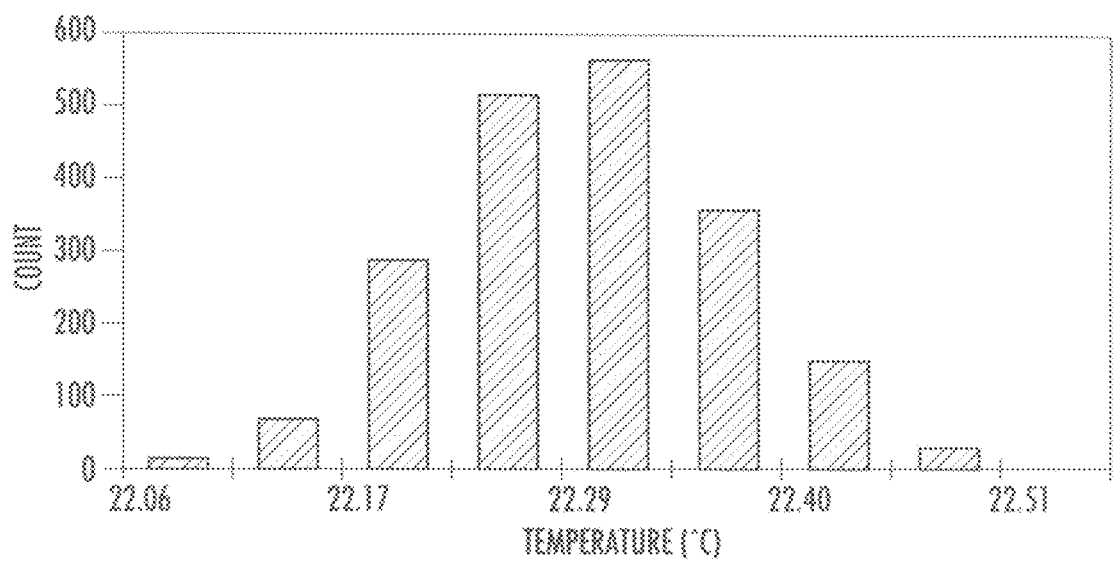
FIG. 8 is a histogram of 2,000 temperature samples collected at room temperature form a disclosed passive wireless sensor.

The very short time required for each temperature reading (~7 μs) enables collecting numerous samples in a very short period of time. FIG. 8 shows the temperature histogram of 2,000 samples with a mean value of 22.27° C. and standard deviation (STD) of 0.07° C. resulting in temperature resolution of less than 0.1° C. which was also verified by experiment. In addition, a maximum D of 3 m was achieved with 500 mW power, though the resolution reduced to 0.6° C.

The temperature resolution is a function of signal to noise ratio at the receiving antenna (oscilloscope). The Friis equation shown below in Equation (3) explains the dependency of the received signal power on different parameters:

$$\frac{P_r}{P_t} = \frac{G_t^2 G_r^2 \lambda^4 \chi}{(4\pi D)^4} \tag{3}$$

where $P_t$ and $P_r$ are the power transmitted and received by the transceiver respectively. $G_t$ and $G_r$ are the gain of the interrogator and sensor antennas respectively, $\lambda$ is the free-space wavelength, and $\chi$ represents the mismatch losses. To further increase D without sacrificing the resolution, higher signal power could be used to interrogate the MEMS piezoelectric resonator. According to equation (3), the resolution achieved at 3 m (0.6° C.) can be maintained at twice the distance if the peak power is increased 16 times. However, the average power could easily be kept below a desired level by reducing the sampling rate.

Figure 9A:
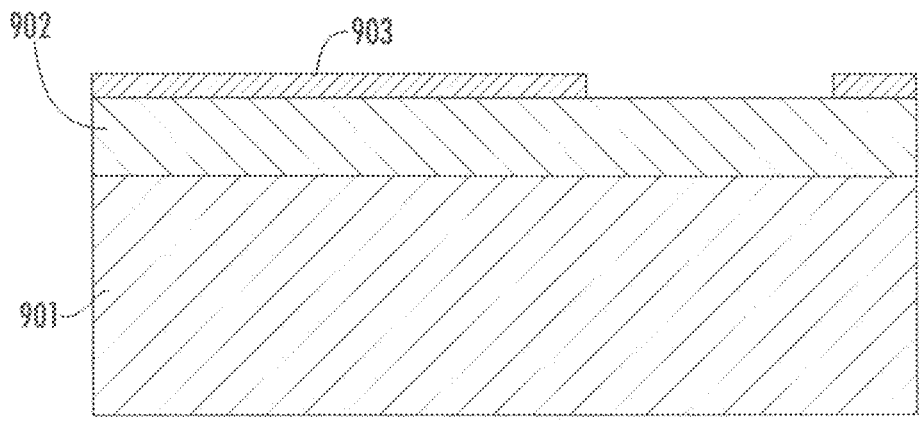
FIGS. 9A-E are successive cross-sectional depictions showing steps in an example fabrication process for forming a disclosed MEMS piezoelectric resonator.
Figure 9B:
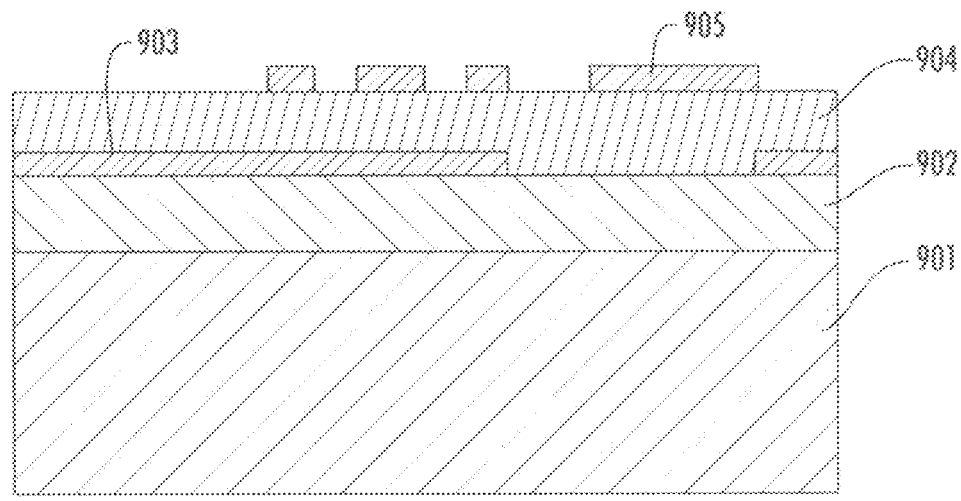

An example fabrication process is now described with reference to the cross-sectional depictions shown in FIGS. 9A-E for forming a disclosed MEMS piezoelectric resonator. FIG. 9A shows the result after patterning a bottom metal layer (or bottom electrode) 903 (e.g., Mo, about 100 nm thick) on a top substrate portion 902 (e.g., silicon) on a handle support 901 (e.g., silicon). Conventional lithography and etching can be used for the patterning. FIG. 9B shows the result after depositing a piezoelectric layer 904 such as AlN (e.g., about 500 nm thick) and then a top metal layer 905 (e.g., Mo, about 100 nm thick), followed by patterning the top metal layer 905.

Figure 9C:
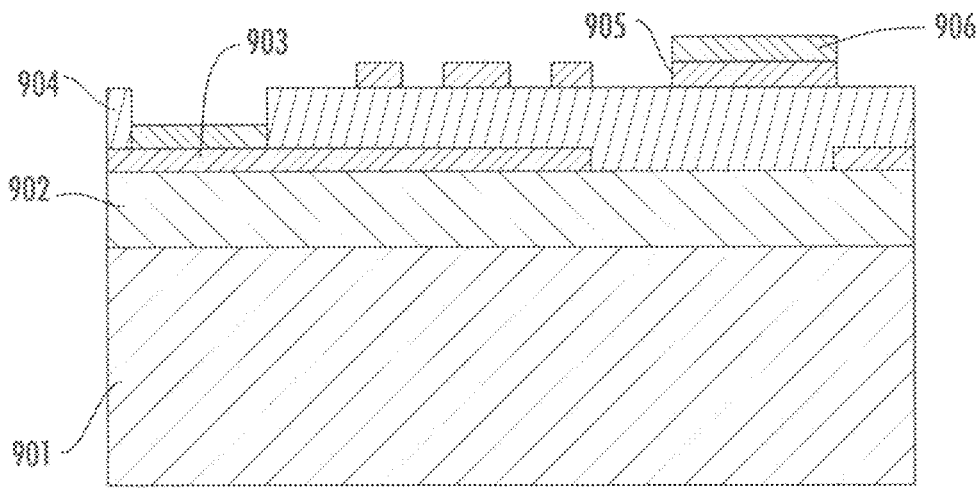
Figure 9D:
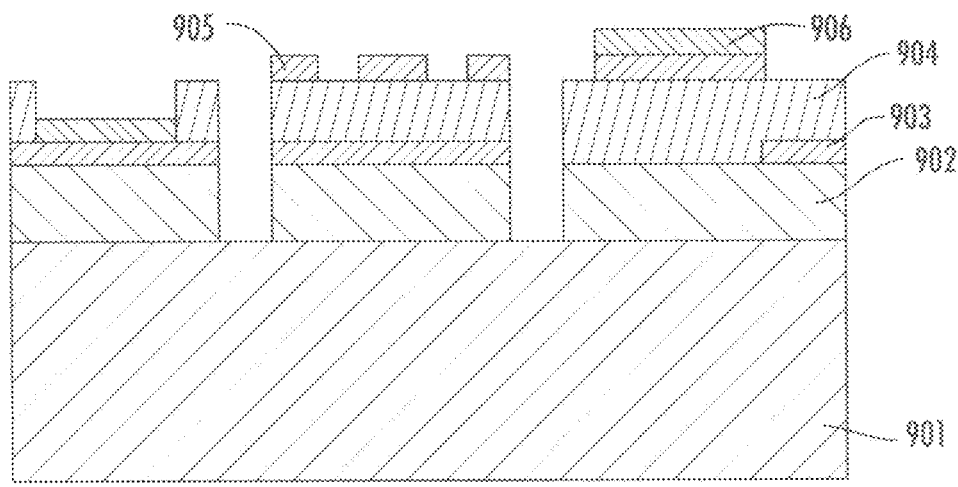
Figure 9E:
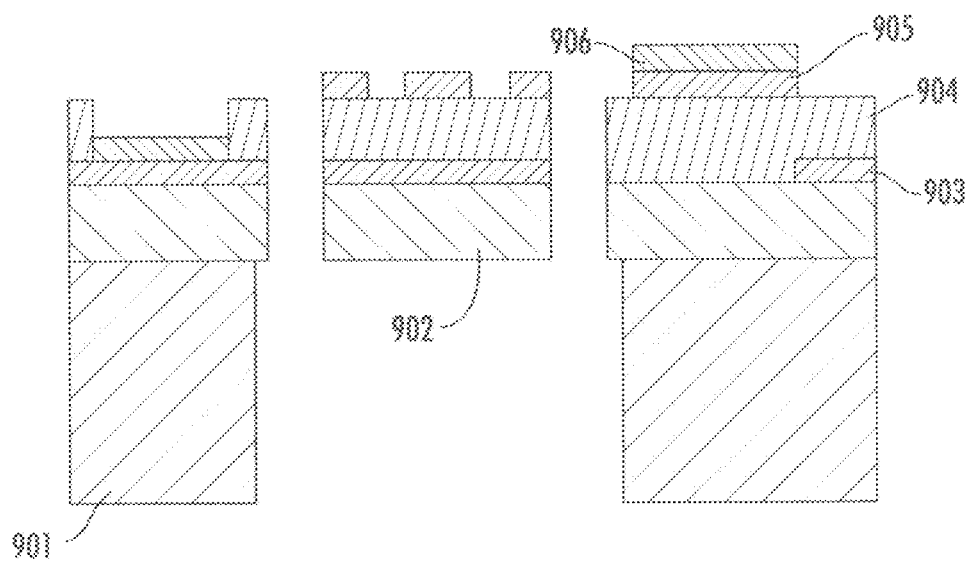

FIG. 9C shows the result after sputtering a contact metal layer 906 for providing improved contact (e.g., Au, about 150 nm thick) on the contact areas of the bottom metal layer 903. FIG. 9D shows the result after etching the stack from the topside down to the handle support 901 followed by FIG. 9E which shows the result after releasing the MEMS piezoelectric resonator by etching the handle support 901 from the backside in order to release the MEMS piezoelectric resonator. Above-described cantilever-shaped beam support portions provided for tethering the MEMS piezoelectric resonator are not shown.

It is noted the top substrate portion 902 is not included for forming a contour-mode MEMS piezoelectric resonator. Moreover, the contact metal layer 906 is an optional layer.

In conclusion, MEMS piezoelectric resonators are believed to be first described herein for passive wireless temperature sensing. For temperature sensing, the temperature-sensitive component is a thin-film piezoelectric-on-silicon resonator shown in FIG. 7 providing a TCF of −30 ppm/° C. The MEMS piezoelectric resonator is directly connected to an antenna with no additional circuitry. The temperature resolution of 0.1° C. was achieved at a sensing distance of 1 m and a peak power of 0.5 W. Further improvement of the temperature resolution can be obtained by using MEMS piezoelectric resonator with higher TCF or higher gain antennas. Moreover, as noted above, disclosed MEMS piezoelectric resonators can be used for the wireless sensing of physical parameters besides temperature, such as pressure, stress and strain.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The invention claimed is:

1. A passive wireless sensor, comprising;
a substrate having a plurality of Microelectromechanical system (MEMS) piezoelectric resonators thereon, each of said plurality of MEMS piezoelectric resonators including:
a piezoelectric layer directly between a top metal layer (top electrode layer) and a bottom metal layer (bottom electrode layer), said bottom electrode layer being on said substrate,
wherein said top electrode layer is a patterned top electrode layer including at least a first electrode for sensing an electrical signal and a second electrode for providing a ground reference; and
an antenna connected to at least one of the first electrode and said second electrode for wirelessly transmitting said electrical signal and for receiving a wireless interrogation signal,
wherein each of said plurality of said MEMS piezoelectric resonators comprises a contour-mode piezoelectric resonator that varying planar dimensions of at least one of said substrate, said bottom electrode layer, said piezoelectric layer, and said top electrode layer to collectively provide two or more different resonant frequencies.

2. The passive wireless sensor of claim 1, wherein said antenna is on said substrate.

3. The passive wireless sensor of claim 1, wherein said substrate has a thick substrate region and a thin substrate region, and wherein each of said plurality of MEMS piezoelectric resonators comprise a thin-film piezoelectric-on-semiconductor (TPoS) resonator on said thin substrate region including:
at least a first and a second zero displacement node provided by first and second cantilever-shaped beam support portions of said thin substrate region for tethering said MEMS piezoelectric resonator to said thick substrate region,
wherein said patterned top electrode layer includes portions over said thick substrate region, and other portions over said first and second cantilever-shaped beam support portions.

4. The passive wireless sensor of claim 1, wherein said substrate comprises a semiconductor substrate having a 25° C. resistivity >1 ohm-cm.

5. The passive wireless sensor of claim 4, wherein said semiconductor substrate comprises silicon.

6. The passive wireless sensor of claim 1, wherein said piezoelectric layer is a thin film layer having a thickness between 100 nm and 5 µm.

7. The passive wireless sensor of claim 1, wherein said top electrode layer includes an interdigitated portion.

8. A method of wirelessly sensing at least one physical parameter, comprising:
wirelessly exciting a plurality of Microelectromechanical system (MEMS) piezoelectric resonators thereon connected to an antenna into oscillation by a wireless interrogation signal,
wherein each of said plurality of said MEMS piezoelectric resonators include a piezoelectric layer directly between a top metal layer (top electrode layer) and a bottom metal layer (bottom electrode layer), said bottom electrode layer being on a substrate, wherein said top electrode layer is a patterned top electrode layer including at least a first electrode for sensing an electrical signal and a second electrode for providing a ground reference, and wherein said antenna connected to at least one of said first electrode and said second electrode for wirelessly transmitting said electrical signal and for receiving said wireless interrogation signal,
wherein each of said plurality of said MEMS piezoelectric resonators further comprises a contour-mode piezoelectric resonator that vary planar dimensions of at least one of said substrate, said bottom electrode layer, said piezoelectric layer, and said top electrode layer to collectively provide two or more different resonant frequencies,
said plurality of MEMS piezoelectric resonators providing a decay response of an amplitude of said oscillation (decay response) responsive to said wireless interrogation signal;
analyzing said decay response to generate said different resonant frequencies; and
determining said physical parameter from said different resonant frequencies.

9. The method of claim 8, wherein said analyzing comprises performing as Fourier transform on said decay response to obtain said different resonant frequencies and said determining said physical parameter from said different resonant frequencies comprises calculating said physical parameter from said different resonant frequencies and a coefficient of said different resonant frequencies as a function of said physical parameter.

10. The method of claim 8, wherein said wireless interrogation signal is tuned to each of said different resonant frequencies of said plurality of MEMS piezoelectric resonators.

11. The method of claim 8, further comprising dynamically tuning a frequency of said wireless interrogation signal during said wirelessly exciting.

12. The method of claim 8, wherein said wireless interrogation signal comprises a pulse-modulated sinusoidal radio frequency (RF) signal.

13. The method of claim 8, wherein pulse-modulated sinusoidal radio frequency (RF) signal is gated in a time domain to provide intervals without said wireless interrogation signal for use during said analyzing.

14. The method of claim 8, wherein each of said plurality of MEMS piezoelectric resonators is operated as a one port resonator.

15. The method of claim 8, wherein each of said plurality of MEMS piezoelectric resonators is operated as a two port resonator.

16. The method of claim 8, wherein said physical parameter comprises, temperature, pressure, stress, or strain.

17. The method of claim 8, wherein each of said plurality of MEMS piezoelectric resonator is within an enclosed volume.

18. The method of claim 17, wherein said enclosed volume comprises an inside of an engine or an inside of a tire.

\* \* \* \* \*